US011775197B2

(12) United States Patent
Schmidt

(10) Patent No.: US 11,775,197 B2
(45) Date of Patent: Oct. 3, 2023

(54) SINGLE COMMAND FOR READING THEN CLEARING DYNAMIC RANDOM ACCESS MEMORY

(71) Applicant: KYOCERA Document Solutions Inc., Osaka (JP)

(72) Inventor: Kenneth A. Schmidt, Redondo Beach, CA (US)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 17/212,258

(22) Filed: Mar. 25, 2021

(65) Prior Publication Data
US 2022/0308784 A1    Sep. 29, 2022

(51) Int. Cl.
*G06F 3/06*    (2006.01)

(52) U.S. Cl.
CPC .......... *G06F 3/0652* (2013.01); *G06F 3/0608* (2013.01); *G06F 3/0673* (2013.01)

(58) Field of Classification Search
CPC ..... G06F 3/0652; G06F 3/0608; G06F 3/0673
See application file for complete search history.

(56) References Cited

U.S. PATENT DOCUMENTS

| 4,649,516 A * | 3/1987 | Chung ................ G11C 11/4093 365/189.12 |
| 4,992,958 A * | 2/1991 | Kageyama ............. G06K 15/00 358/1.17 |
| 5,684,978 A | 11/1997 | Sarma et al. |
| 6,697,989 B1 * | 2/2004 | Maeda ............... H03M 13/6325 714/755 |
| 7,325,052 B1 * | 1/2008 | Motoyama ............ G06F 21/554 358/1.14 |
| 7,610,437 B2 * | 10/2009 | Sinclair ................. G06F 3/0652 711/104 |
| 7,984,084 B2 * | 7/2011 | Sinclair ............... G06F 16/1847 707/818 |
| 8,285,918 B2 * | 10/2012 | Maheshwari ....... G06F 12/0891 711/159 |

(Continued)

FOREIGN PATENT DOCUMENTS

| CA | 2388117 C | * 12/2005 | ............. G06F 21/62 |
| CN | 103765430 A | * 4/2014 | ............. G06F 21/53 |

(Continued)

OTHER PUBLICATIONS

TheBeard, "DRAM Commands", Feb. 18, 2020, pp. 1-6, http://thebeardsage.com/dram-commands/ (Year: 2020).*

(Continued)

*Primary Examiner* — Christopher D Birkhimer
(74) *Attorney, Agent, or Firm* — GrowIP Law Group LLC

(57) ABSTRACT

A method includes receiving, at a dynamic random access memory (DRAM) device, a single READ-THEN-CLEAR command. The single READ-THEN-CLEAR command has a column address of a column in an array of memory cells. Particular data content is stored in memory cells associated with the column address. The method also includes, in response to receiving the single READ-THEN-CLEAR command, reading the particular data content and clearing the particular data content after reading the particular data content.

15 Claims, 7 Drawing Sheets

(56) References Cited

U.S. PATENT DOCUMENTS

| | | | | |
|---|---|---|---|---|
| 8,443,263 | B2* | 5/2013 | Selinger | G06F 11/1068 |
| | | | | 714/768 |
| 8,873,284 | B2* | 10/2014 | Sinclair | G06F 12/0246 |
| | | | | 365/185.11 |
| 9,223,693 | B2* | 12/2015 | Sinclair | G06F 12/0246 |
| 9,305,619 | B2 | 4/2016 | Cordero et al. | |
| 9,336,133 | B2* | 5/2016 | Sinclair | G06F 12/0246 |
| 9,348,746 | B2* | 5/2016 | Sinclair | G06F 12/0246 |
| 9,465,731 | B2* | 10/2016 | Sinclair | G06F 3/0688 |
| 9,734,050 | B2* | 8/2017 | Sinclair | G06F 12/0253 |
| 9,734,911 | B2* | 8/2017 | Sinclair | G06F 3/0658 |
| 9,778,855 | B2* | 10/2017 | Sinclair | G06F 3/064 |
| 10,108,543 | B1* | 10/2018 | Duggal | G06F 11/1453 |
| 10,108,544 | B1* | 10/2018 | Duggal | G06F 11/14 |
| 10,120,613 | B2* | 11/2018 | Sinclair | G06F 12/02 |
| 10,133,490 | B2* | 11/2018 | Sinclair | G06F 3/0655 |
| 10,255,179 | B2* | 4/2019 | Ji | G06F 3/0659 |
| 10,430,279 | B1* | 10/2019 | Dittia | G06F 3/0656 |
| 10,795,812 | B1* | 10/2020 | Duggal | G06F 3/067 |
| 10,983,715 | B2* | 4/2021 | Sharoni | G06F 21/10 |
| 11,086,537 | B2* | 8/2021 | Byun | G06F 3/0679 |
| 2007/0033325 | A1* | 2/2007 | Sinclair | G06F 3/0608 |
| | | | | 711/170 |
| 2008/0082596 | A1* | 4/2008 | Gorobets | G06F 12/0253 |
| 2008/0189477 | A1* | 8/2008 | Asano | G06F 12/0246 |
| | | | | 711/E12.008 |
| 2011/0066903 | A1* | 3/2011 | Foster, Sr. | G06F 1/206 |
| | | | | 714/E11.169 |
| 2011/0145473 | A1* | 6/2011 | Maheshwari | G06F 12/0873 |
| | | | | 711/E12.008 |
| 2011/0161784 | A1* | 6/2011 | Selinger | G06F 11/1016 |
| | | | | 714/E11.002 |
| 2014/0168341 | A1* | 6/2014 | Wilsher | B41J 2/32 |
| | | | | 347/179 |
| 2014/0171307 | A1* | 6/2014 | Wilsher | B41M 5/30 |
| | | | | 503/201 |
| 2014/0195764 | A1* | 7/2014 | Shen | G06F 3/0673 |
| | | | | 365/230.02 |
| 2014/0208156 | A1* | 7/2014 | Muralimanohar | G06F 3/0625 |
| | | | | 714/6.24 |
| 2014/0325148 | A1* | 10/2014 | Choi | G06F 3/0659 |
| | | | | 711/114 |
| 2014/0365719 | A1* | 12/2014 | Kuzmin | G06F 12/0246 |
| | | | | 711/103 |
| 2015/0227602 | A1* | 8/2015 | Ramu | G06F 11/1456 |
| | | | | 707/634 |
| 2016/0188209 | A1* | 6/2016 | Hansson | G06F 3/0659 |
| | | | | 711/156 |
| 2016/0246713 | A1* | 8/2016 | Choi | G06F 3/0608 |
| 2017/0123655 | A1* | 5/2017 | Sinclair | G06F 3/061 |
| 2018/0074702 | A1* | 3/2018 | Chen | G06F 3/061 |
| 2018/0188994 | A1* | 7/2018 | Srikanth | G06F 3/0608 |
| 2018/0189175 | A1* | 7/2018 | Ji | G06F 3/0679 |
| 2019/0196721 | A1* | 6/2019 | Magro | G06F 13/1684 |
| 2020/0089420 | A1* | 3/2020 | Sharoni | G06F 3/0637 |
| 2020/0310686 | A1* | 10/2020 | Truong | G06F 3/067 |

FOREIGN PATENT DOCUMENTS

| | | | | | |
|---|---|---|---|---|---|
| JP | 01241457 | A | * | 9/1989 | |
| JP | 2002191003 | A | * | 7/2002 | H04N 1/0044 |
| JP | 2003186657 | A | * | 7/2003 | |
| JP | 5195856 | B2 | * | 5/2013 | G06F 3/122 |

OTHER PUBLICATIONS

Microsoft, "Computer Dictionary", Fifth Edition, 2002, p. 349 (Year: 2002).*

Time Fisher, "Data Sanitization Methods A List of Software Based Data Sanitization Methods", Apr. 6, 2017, pp. 1-13, https://web.archive.org/web/20170406061555/https://www.lifewire.com/data-sanitization-methods-2626133 (Year: 2017).*

Oliver Jones, "What Is Printer Memory", Mar. 14, 2019, pp. 1-3, https://web.archive.org/web/20190314185642/https://www.techwalla.com/articles/what-is-printer-memory (Year: 2019).*

Thomas Oppong, "The Benefits of Extra Printer Memory for Business Users", Apr. 15, 2014, pp. 1-8, https://alltopstartups.com/2014/04/15/the-benefits-of-extra-printer-memory/ (Year: 2014).*

Pravin Mehta, "DoD Wiping—The Secure Wiping Standard to Get Rid of Data", Jan. 23, 2021, pp. 1-3, https://web.archive.org/web/20210123054231/https://www.bitraser.com/blog/dod-wiping-the-secure-wiping-standard-to-get-rid-of-data/ (Year: 2021).*

Anonymous, "DRAM Memory Access Protocols develop generic model for thinking about timing", Feb. 15, 2021, pp. 1-22, https://web.archive.org/web/20210215020810/https://my.eng.utah.edu/~cs7810/pres/dram-cs7810-protocolx2.pdf (Year: 2021).*

J. Lee et al., "Memory Command", 2017, pp. 1-18, https://www.sciencedirect.com/topics/computer-science/memory-command (Year: 2017).*

Anonymous, "Fly-by Command Address", Sep. 8, 2015, pp. 1-6, https://web.archive.org/web/20150908174957/https://www.rambus.com/fly-by-command-address/ (Year: 2015).*

GeeksforGeeks, "move cmd command", Oct. 20, 2020, pp. 1-9, https://www.geeksforgeeks.org/move-cmd-command/ (Year: 2020).*

Stephen St. Michael, "Executing Commands in Memory: DRAM Commands", Aug. 9, 2019, pp. 1-7, https://www.allaboutcircuits.com/technical-articles/executing-commands-memory-dram-commands/ (Year: 2019).*

* cited by examiner

SINGLE COMMAND FOR READING THEN CLEARING DYNAMIC RANDOM ACCESS MEMORY

BACKGROUND

In recent years, various types of printing devices have become popular for both business and consumer use. In addition to traditional black and white printers, color printers, scanners, copiers, fax machines, and other components are now common. Multi-function peripherals (MFPs) that support two or more of these functions are also widely available.

Among other functions, these printing devices are used to print graphics or text onto a printing surface, such as paper. Such printing processes can include reading and writing data into memory cells of a dynamic random access memory (DRAM) device. For instance, image data can be written into particular memory cells of the DRAM device, the image data can be read from the particular memory cells, and the particular memory cells can be cleared for reuse. This process can involve receiving and executing various DRAM commands, such as READ commands for reading the image data from the particular memory cells, as well as WRITE commands for clearing the particular memory cells.

It is desirable to improve on these arrangements or at least to provide one or more useful alternatives to help to improve printing processes.

SUMMARY

In one aspect, a method includes receiving, at a dynamic random access memory (DRAM) device, a single READ-THEN-CLEAR command. The single READ-THEN-CLEAR command has a column address of a column in an array of memory cells. Particular data content is stored in memory cells associated with the column address. The method also includes, in response to receiving the single READ-THEN-CLEAR command, reading the particular data content and clearing the particular data content after reading the particular data content.

In a further aspect, a printing system is described. The printing system includes an initiator configured to generate a memory command associated with a read operation and a clear operation. The printing system also includes a memory network configured to provide the memory command to a dynamic random access memory (DRAM) controller. The DRAM controller is configured to translate the memory command to a single READ-THEN-CLEAR command. The single READ-THEN-CLEAR command has a column address of a column in an array of memory cells in a DRAM device. Particular data content is stored in memory cells associated with the column address. The DRAM controller is also configured to provide the single READ-THEN-CLEAR command to the DRAM device. The DRAM device is configured to receive the single READ-THEN-CLEAR command. In response to receiving the single READ-THEN-CLEAR command, the DRAM device is configured to read the particular data content and clear the particular data content after reading the particular data content.

In a further aspect, a dynamic random access memory (DRAM) controller is described. The DRAM controller is configured to issue a single READ-THEN-CLEAR command that has a column address of a column in an array of memory cells in a DRAM device. Particular data content is stored in memory cells associated with the column address. In response to receiving the single READ-THEN-CLEAR command, the DRAM device reads the particular data content and clears the particular data content after reading the particular data content These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Figure 1:
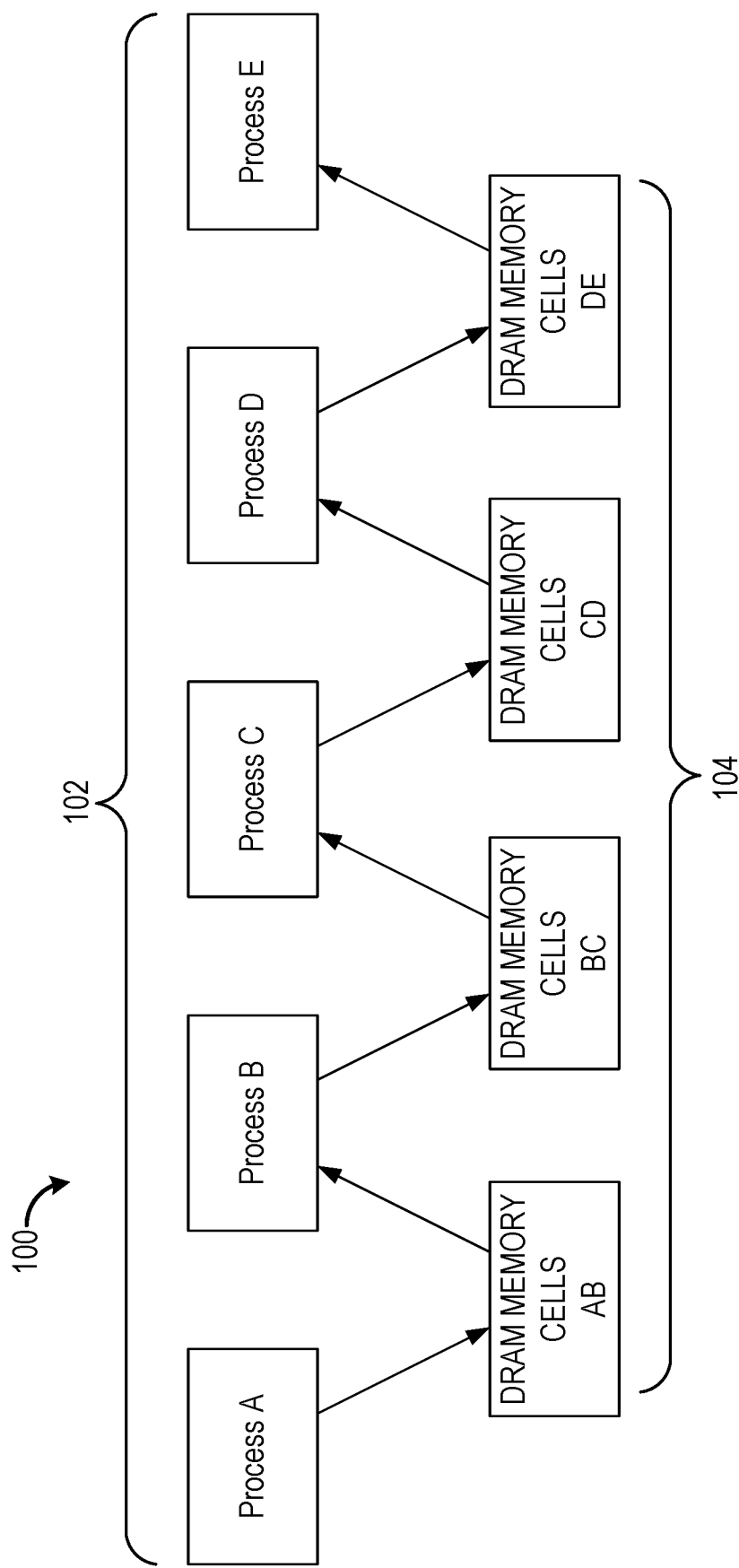
FIG. 1 is a flow diagram of a printing process, according to an example embodiment.

Example methods and systems are described herein. Other example embodiments or features may further be utilized, and other changes may be made, without departing from the scope of the subject matter presented herein. In the following detailed description, reference is made to the accompanying figures, which form a part thereof.

The ordinal terms first, second, and the like in the description and in the claims are used for distinguishing between similar elements and not necessarily for describing a sequence, either temporally, spatially, in ranking, or in any other manner. As such, it is to be understood that the ordinal terms can be interchangeable under appropriate circumstances.

The example embodiments described herein are not meant to be limiting. Thus, aspects of the present disclosure, as generally described herein and illustrated in the figures, can be arranged, substituted, combined, separated, and designed in a wide variety of different configurations, all of which are explicitly contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. OVERVIEW

Illustrative embodiments relate to example printing systems and corresponding printing methods. However, the systems and methods disclosed herein should not be viewed as being limited to printing technologies and can instead be applied to any system or method that involves reading data from dynamic random access memory (DRAM) cells and then clearing the read data from the DRAM cells for future use. In connection with printing systems and methods, aspects of the present disclosure can be used to reduce the amount and time of computational processing of image data when printing an image. As used herein, the term "data content" can refer to image data, such as pictorial data, textual data, and/or any other data that is destined to be reproduced in printed form. It should be understood that the term "data content" can also be used to describe data associated with other technological processes that are distinct from printing technologies.

In particular, printing an image can include a pipeline of multiple processes that (i) read particular data content (e.g., data values corresponding to image data) from particular memory cells (e.g., DRAM cells) in a DRAM device and (ii) write to other memory cells in the DRAM device. The memory cells can be reused throughout the printing process. For instance, after the particular data content has been read from a first group of memory cells in the DRAM device, processed, and written to a second group of memory cells in the DRAM device, the first group of memory cells can be cleared for future use. Typically, the first group of memory cells are initialized before reuse. For example, zero data values can be written in the first group of memory cells to initialize and reuse the first group of memory cells.

In a conventional printing system, each of the above steps can include a DRAM controller issuing a series of DRAM commands. For instance, reading the particular data content from the first group of memory cells in the DRAM device can include the DRAM device issuing an ACTIVATE command to a DRAM device. Based on the ACTIVATE command, the DRAM device selects a row associated with the first group of memory cells. Selecting the row causes the particular data content in the first group of memory cells, and other data content within the row, to latch to a row buffer. After the ACTIVATE command is issued, a READ command can be issued by the DRAM controller to the DRAM device. Based on the READ command, the DRAM device reads the particular data content from the row buffer. For example, the READ command has a column address that indicates a column associated with the particular data content. A column decoder uses the column address to select the particular data content from the other data content in the row buffer. Based on the selection, the particular data content is output to be read.

Writing the particular data content to the second group of memory cells can include issuing a series of WRITE commands, and clearing (e.g., initializing) the particular data content from the first group of memory cells can include issuing another series of WRITE commands. In a DRAM system carrying out a large number of these printing processes across a large number of memory cells, issuing separate series of commands for each of these operations can consume significant computational resources and time. Further, each WRITE command can include a payload of write data that is to be written as a result of executing the command. Processing the write data for each series of WRITE commands can further increase the computational resources and time consumed by these printing processes.

The present disclosure provides printing systems and methods for reducing the computational resources and time consumed during the printing process. In particular, the present disclosure provides systems and methods for using a series of single READ-THEN-CLEAR commands to read data from memory cells in a DRAM device and subsequently clear the memory cells for reuse.

Using single READ-THEN-CLEAR commands provides a number of improvements. One improvement is that the number of issued DRAM commands can be reduced. For instance, the steps of reading data from the DRAM cells and writing zeros to those DRAM cells can be carried out by issuing singular READ-THEN-CLEAR commands, instead of issuing two separate series of commands, namely a series of READ commands and a series of WRITE commands. Another improvement is that the quantity of write data that is issued during printing can be reduced. For instance, as noted above, when clearing DRAM cells, a conventional write command usually includes write data that specifies writing zeros into the DRAM cells. However, in accordance with the present disclosure, a DRAM controller of a printing system can be designed to automatically infer writing zeros into the DRAM cells in response to issuance of the READ-THEN-CLEAR command. Other benefits will be apparent to those skilled in the art.

II. EXAMPLE SYSTEMS AND METHODS

FIG. 1 depicts a flow diagram of a printing pipeline 100, according to an example embodiment. As shown, the printing pipeline 100 can include various processes 102 (identified as Process A, Process B, Process C, Process D, and Process E) performed on various dynamic random access memory (DRAM) cells 104 (identified as DRAM memory cells AB, DRAM memory cells BC, DRAM memory cells CD, and DRAM memory cells DE). The processes 102 can be performed based on DRAM commands issued by a DRAM controller. Each group of DRAM memory cells 104 can be identified (e.g., located) using a corresponding row and column in a bank (e.g., an array) of memory cells.

The processes 102 can be performed by various memory components of a printing system, including a DRAM controller that issues DRAM commands. According to some implementations, the DRAM commands can be generated based on memory commands received by one or more initiators. For example, in some embodiments, an initiator can reference linear memory addresses and corresponding memory commands for the memory addresses. The initiator provides the memory addresses and the corresponding memory commands to the DRAM controller. The DRAM controller can translate the memory addresses into multiple address parts of a DRAM device (e.g., a bank group, a bank, a row address, and a column address) and can translate the memory commands into DRAM commands that are used to perform the process illustrated in FIG. 1. Such components are explained in further detail below, and some or all of these components can take the form of, or be included as part of, logic circuitry or a hardware module that processes data, such as one or more general purpose processors and/or one or more dedicated processors (e.g., application specific integrated circuits (ASICs) or digital signal processors (DSPs), etc.).

In the context of FIG. 1, Process A can include (i) initializing the DRAM memory cells AB and (ii) rendering image data into the initialized DRAM memory cells AB. Initializing DRAM memory cells AB can include clearing the DRAM memory cells AB (e.g., writing zeros into the DRAM memory cells AB). To write zeros into the DRAM memory cells AB, the DRAM controller can issue an ACTIVATE command to a DRAM device. Based on the ACTIVATE command, the DRAM device selects a row associated with the DRAM memory cells AB. Selecting the row latches all of the data content associated with the row, including the data content of the DRAM memory cells AB, to a row buffer.

Once all of the data content associated with the row is latched to the row buffer, the DRAM controller can issue a series of write commands to write zero values into the DRAM memory cells AB.

Rendering the image data into the initialized DRAM memory cells AB can include issuing a series of read and write operations that identify parts (e.g., rows and columns) associated with the DRAM memory cells AB and that, for write operations, include write data indicating the image data that is to be written into the DRAM memory cells AB. As an example, rendering image data into the initialized DRAM memory cells AB can include adding a number of objects to DRAM memory cells AB. Objects can include individual characters or vector objects, such as lines, rectangles, circles, photographs, or the like. Objects can overlap, such that adding objects to the DRAM memory cells AB can involve adding a subsequent object "on top of" a previously rendered object. This can include blending the overlapping portion of the objects, such that adding the subsequent object includes reading data from DRAM memory cells AB that corresponds to the overlapping portion of the objects, computing data that corresponds to the blend of the objects, and writing the blended object data into DRAM memory cells AB.

Process B can include reading the image data from the DRAM memory cells AB, processing the image data, and writing the processed data into the DRAM memory cells BC. Reading the image data from the DRAM memory cells AB can include issuing, at the DRAM controller, a READ command to the DRAM device. Based on the READ command, the DRAM device can read the DRAM memory cells AB. Process B can further include causing the read image data to be processed in various ways, such as by compressing the image data, color converting the image data, halftoning the image data, or transmitting the image data to another computing device, such as to another chip, disk, controller board, system, or computer. Process B can then include issuing, at the DRAM controller, a WRITE command to the DRAM device. Based on the WRITE command, the DRAM device can write the processed image data into the DRAM memory cells BC. Writing the processed image data into the DRAM memory cells BC can include issuing a write operation that identifies the DRAM memory cells BC as the write address and that includes write data indicating the processed image data that is to be written into the DRAM memory cells BC.

With the image data having been read from the DRAM memory cells AB, processed, and written into the DRAM memory cells BC, the DRAM memory cells AB can be reused in connection with different image data. For instance, the DRAM memory cells AB can be reinitialized by writing zeros into the DRAM memory cells AB (e.g., "clearing the DRAM memory cells AB), and new image data can be rendered into DRAM memory cells AB. As described with further detail below, a single READ-THEN-CLEAR DRAM command is introduced to read DRAM memory cells AB and subsequently clear the DRAM memory cells AB.

Processes C, D, and E can involve performing operations similar to those described above in connection with Processes A and B, but in connection with DRAM memory cells BC, CD, and DE. Further, the printing pipeline 100 can involve carrying out some or all of the above processes a number of times when printing an image.

Figure 2A:
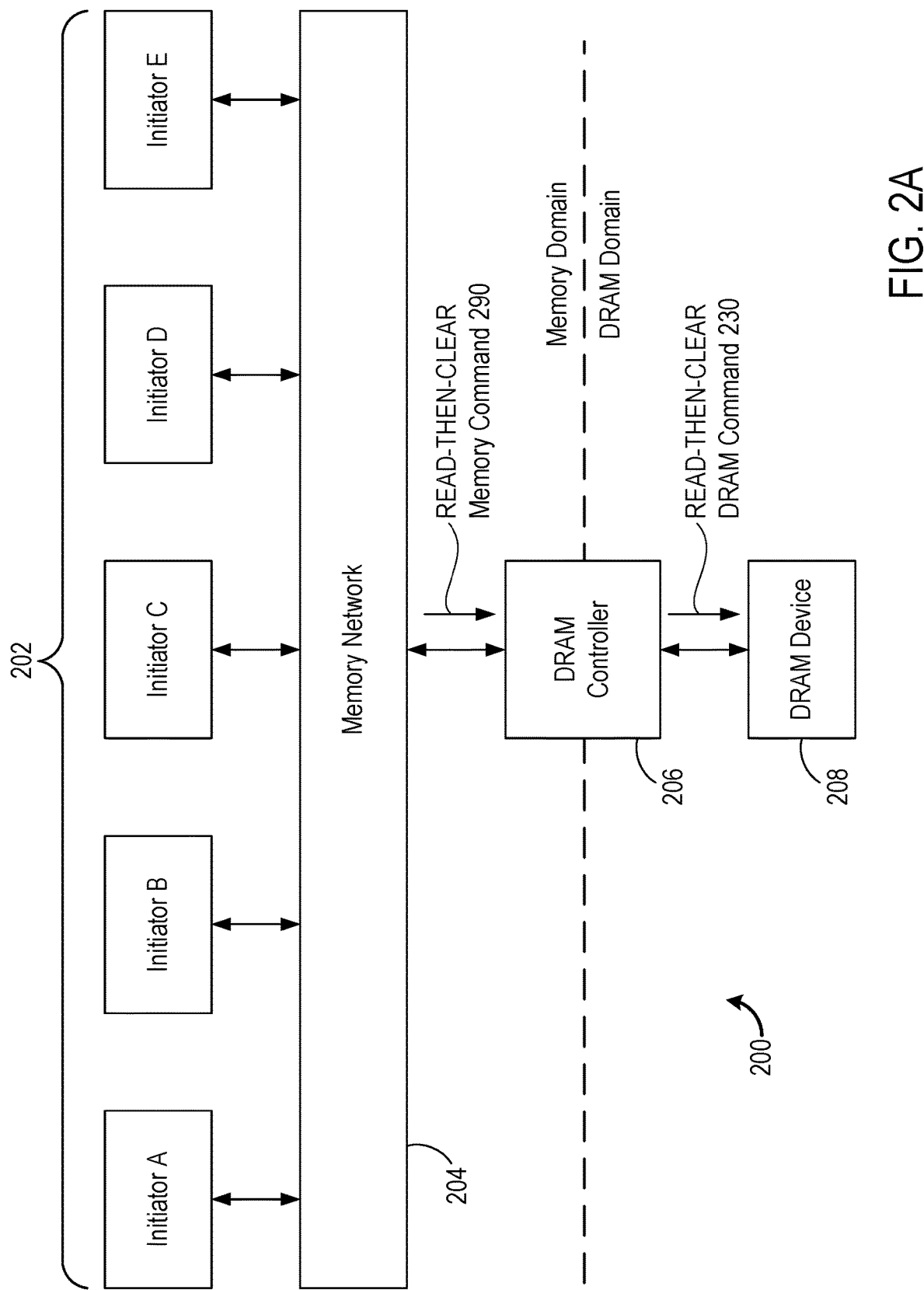
FIG. 2A is a simplified block diagram of a printing system, according to an example embodiment.
Figure 2B:
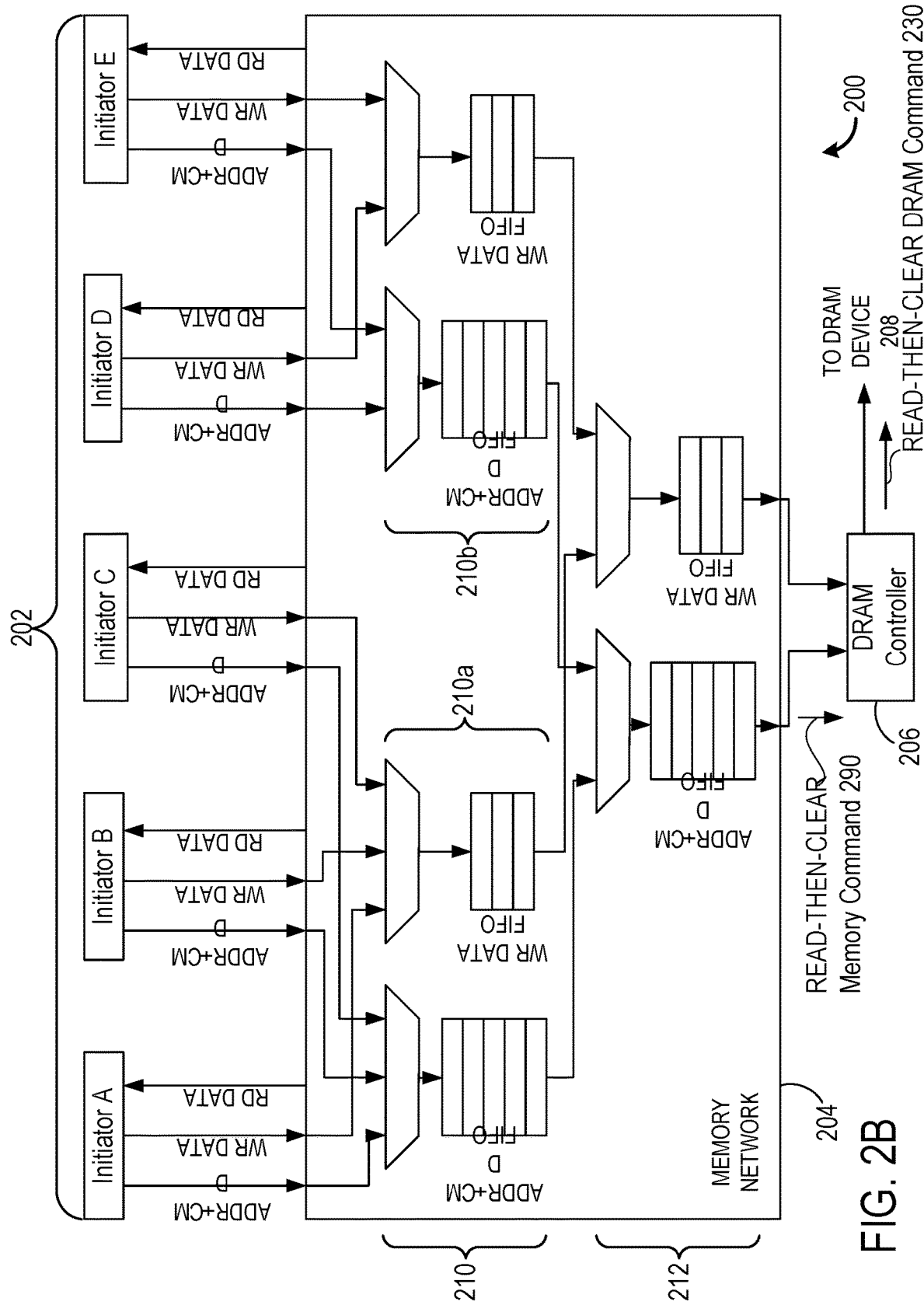
FIG. 2B is another simplified block diagram of the printing system depicted in FIG. 2A, according to an example embodiment.
Figure 2C:
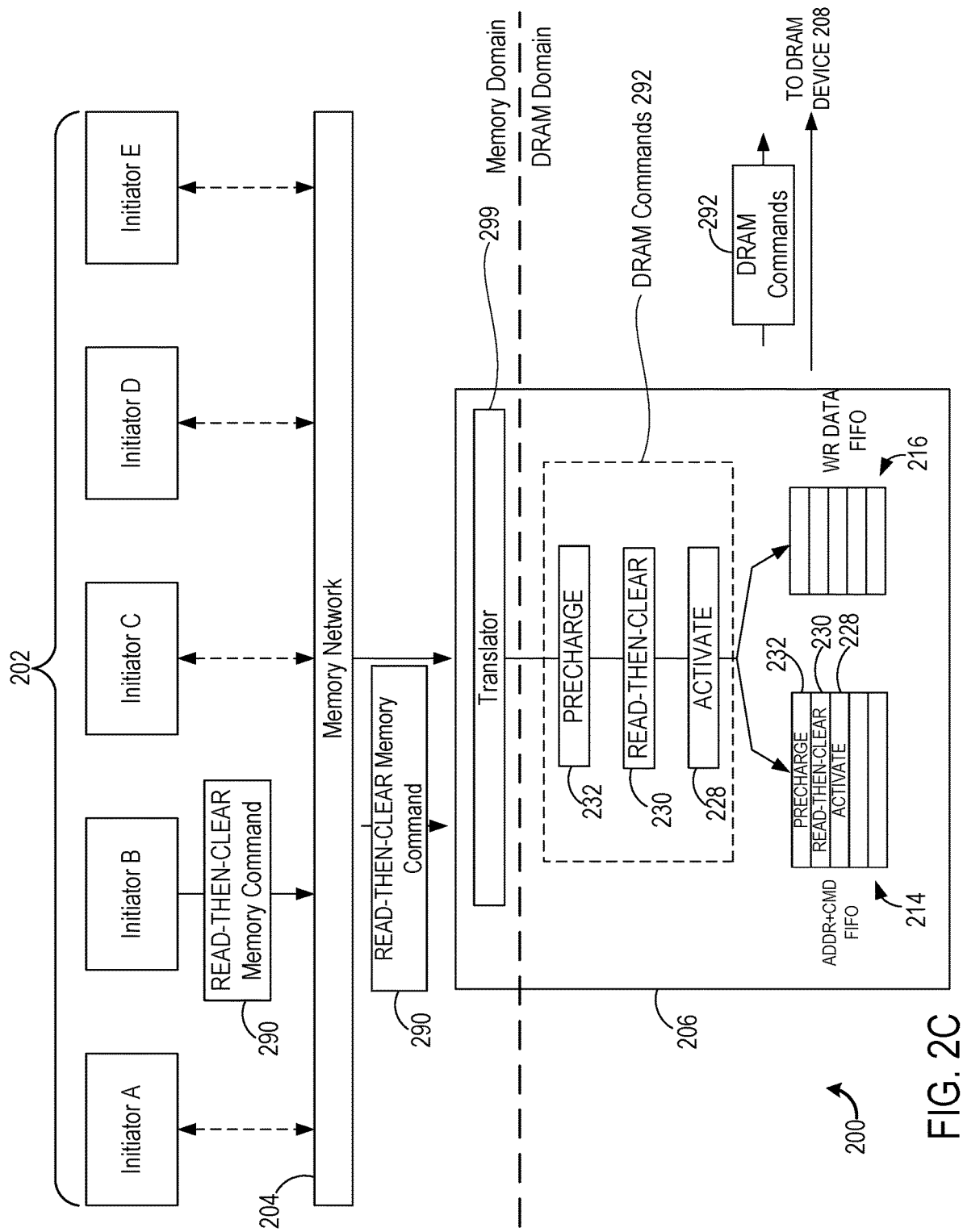
FIG. 2C is another simplified block diagram of the printing system depicted in FIG. 2A, according to an example embodiment.

FIGS. 2A-2C next illustrate in more detail how a printing system processes and stores image data using a printing pipeline, such as the printing pipeline 100 depicted in FIG. 1.

FIG. 2A illustrates a printing system 200, according to an example embodiment. The printing system 200 depicted in FIG. 2A can be capable of performing the processes 102 in the printing pipeline 100 depicted in FIG. 1. In particular, the printing system 200 can read the DRAM memory cells AB and subsequently clear the DRAM memory cells AB based on a single READ-THEN-CLEAR command, as described below.

As shown, the printing system 200 can include various initiators 202 (identified as Initiator A, Initiator B, Initiator C, Initiator D, and Initiator E). The printing system 200 can further include a memory network 204, a DRAM controller 206, and a DRAM device 208. Although a single DRAM device 208 is illustrated in FIG. 2A, in other implementations, the printing system 200 can include a plurality of DRAM devices. The initiators 202, the memory network 204, the DRAM controller 206, and the DRAM device 208 can be interconnected by a system bus or similar mechanism.

During a printing process, the initiators 202 can initiate one or more memory commands, such as a READ-THEN-CLEAR memory command 290. Upon execution in a memory domain, the READ-THEN-CLEAR memory command 290 enables memory cells to be read and subsequently cleared for reuse. Although the READ-THEN-CLEAR memory command 290 is illustrated in FIG. 2A, the initiators 202 can also issue other memory commands to read from and/or write to memory cells. A memory command packages a request to read from or write to memory and can include (i) a type of memory operation (e.g., read-then-clear, as described herein, read, or write), also referred to as a memory command, (ii) a memory address at which to perform the operation, and (iii) in examples where the command is a write command, write data to be written at the memory address.

The memory network 204 can receive a memory command issued by the initiators 202, such as the READ-THEN-CLEAR memory command 290. The memory network 204 can arbitrate and multiplex the memory commands to prioritize the order in which the memory commands are provided to the DRAM controller 206. The DRAM controller 206 can translate the memory commands into DRAM commands. For example, the DRAM device 208 is in a different domain than the memory network 204, which may call for translation of the memory commands into the DRAM commands. To illustrate, the memory network 204 is in a memory domain, and the DRAM device 208 is in a DRAM domain. The DRAM controller 206 is configured to translate the memory commands of the memory domain into DRAM commands of the DRAM domain.

The DRAM commands can include PRECHARGE commands, WRITE commands, READ commands, ACTIVATE commands, and as described herein, single "READ-THEN-CLEAR" commands. The DRAM controller 206 can translate the memory addresses identified by the memory initiators 202 into multiple address parts of the DRAM device 208 (e.g., a bank group, a bank, a row address, and a column address). Thus, the DRAM controller 206 can translate the READ-THEN-CLEAR memory command 290 to a single READ-THEN-CLEAR command 230 (e.g., a device command or a "DRAM command") before issuing the single READ-THEN-CLEAR command 230 to the DRAM device 208. According to some implementations, the DRAM controller 206 can also modify the order of, or generate supplemental, device commands issued to the DRAM device 208. For example, in some scenarios as described below, the DRAM controller 206 can issue an ACTIVATE command prior to issuing the single READ-THEN-CLEAR command 230.

The DRAM controller 206 can include a scheduler, in the form of logic circuitry, to manage the order of the commands. The scheduler is designed to generate a sequence of device commands that maximizes throughput of memory devices. The scheduler's ability to do so, in part, depends on the variety of commands the scheduler can select from. More commands can yield more variety, so the flow of commands into the DRAM controller 206 can be an important factor for providing a scheduler with the capability of generating an improved or optimal sequence.

FIG. 2B illustrates the printing system 200 with the memory network 204 shown in more detail to further illustrate its functionality.

The memory network 204 connects the initiators 202 to the DRAM controller 206. The memory network 204 accepts memory commands (e.g., READ memory commands, WRITE memory commands, READ-THEN-CLEAR memory commands, etc.) from each initiator 202, and the memory network 204 arbitrates and multiplexes the memory commands until a single memory command is funneled into the DRAM controller 206.

In order to facilitate this funneling of memory commands to the DRAM controller 206, the memory network 204 can include multiple levels of first in first out (FIFO) buffers and multiplexers. As shown, the memory network 204 includes two levels of FIFO buffers and multiplexers, including a first level 210 and a second level 212. The first level 210 includes a first subset 210a of FIFO buffers and multiplexers and a second subset 210b of FIFO buffers and multiplexers. However, the arrangement depicted in FIG. 2B is for illustrative purposes only, and in other examples the memory network 204 can include additional or fewer levels and/or in different configurations.

The first subset 210a of FIFO buffers and multiplexers can receive memory commands, such as the READ-THEN-CLEAR memory command 290, from Initiator A, Initiator B, and Initiator C, and the first subset 210a of FIFO buffers and multiplexers funnels data from those memory commands into an address and command (ADDR+CMD) FIFO buffer and a write data (WR DATA) FIFO buffer. Similarly, the second subset 210b of FIFO buffers and multiplexers can receive memory commands from Initiator D and Initiator E, and the second subset 210b of FIFO buffers and multiplexers funnels data from those commands into another ADDR+CMD FIFO buffer and WR DATA FIFO buffer.

The second level 212 of FIFO buffers and multiplexers can then funnel the data from the ADDR+CMD FIFO buffers and WR DATA buffers of the first level 210 into a single ADDR+CMD FIFO buffer and WR DATA FIFO buffer for output to the DRAM controller 206. As described above, the DRAM controller 206 can translate the memory commands from the memory network 204 into DRAM commands. For example, the DRAM controller 206 can translate the READ-THEN-CLEAR memory command 290 into the single READ-THEN-CLEAR DRAM command 230. Additionally, the DRAM controller 206 can translate the memory addresses identified by the memory initiators 202 into multiple address parts of the DRAM device 208 (e.g., a bank group, a bank, a row address, and a column address). Thus, the DRAM controller 206 can translate the memory commands to device commands before issuing the device commands to the DRAM device 208.

FIG. 2C illustrates the printing system 200 with the DRAM controller 206 shown in more detail to further illustrate its functionality.

The DRAM controller 206 includes a translator 299 that is configured to translate the READ-THEN-CLEAR memory command 290 into DRAM commands 292. The DRAM command 292 include an ACTIVATE command 228, the single READ-THEN-CLEAR command 230, and a PRECHARGE command 232. Thus, in addition to generating the single READ-THEN-CLEAR command 230 based on the READ-THEN-CLEAR memory command 290, the translator 299 can generate the ACTIVATE command 228 and can queue the ACTIVATE command 228 to issue prior to issuance of the single READ-THEN-CLEAR command 230.

Figure 3:
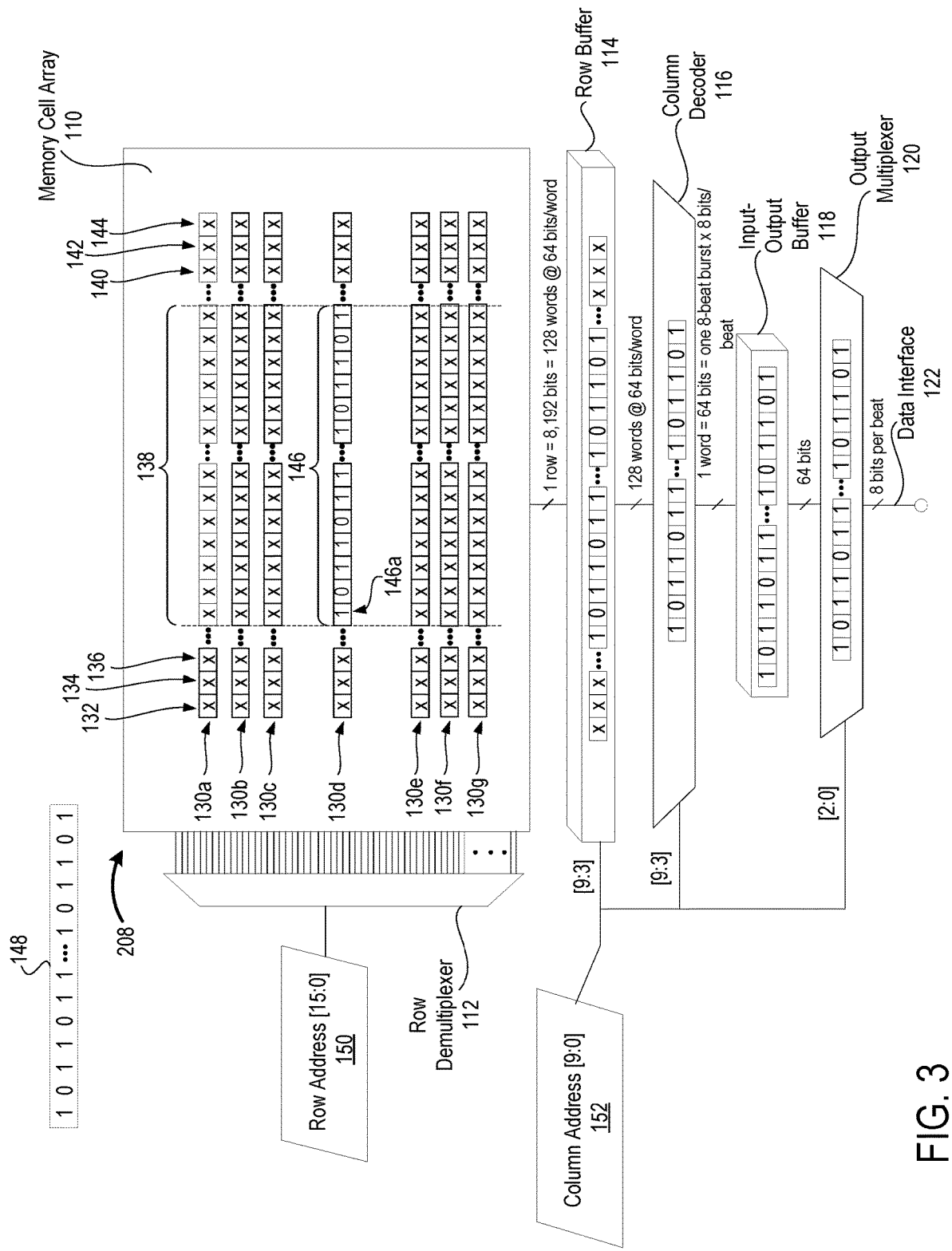
FIG. 3 is a diagram of a dynamic random access memory (DRAM) device that is operable to process a single read-then-clear command.

In the embodiment of FIG. 2C, the DRAM controller 206 includes various FIFO buffers to support the flow of the DRAM commands 292 out of the DRAM controller 206. For instance, the DRAM controller 206 can include a first FIFO buffer for DRAM addresses (e.g., bank groups, banks, row addresses, column addresses, etc.) and DRAM commands generated by the translator 299, a second FIFO buffer for write data, and a third FIFO buffer for read data received from the DRAM device 208. For simplification purposes, FIG. 2C only shows an ADDR+CMD FIFO buffer 214 and a WR DATA FIFO buffer 216 of the DRAM controller 206. As described below, the architecture illustrated in FIG. 2C can be used to issue DRAM commands to the DRAM device 208 (e.g., an example DRAM device of a printing system using a single READ-THEN-CLEAR command). An illustrative example of the DRAM device 208 is depicted in FIG. 3. For ease of description, the architecture of the DRAM device 208 is described prior to the operational description of the printing system 200.

FIG. 3 is an example diagram of the DRAM device 208. It should be understood that the architecture illustrated in FIG. 3 is for illustrative purposes only and should not be construed as a limiting architecture for a DRAM device. The techniques described herein can be implemented using one or more DRAM devices having different architectures. Moreover, while the following examples are described with respect to a memory bank of a particular size, other sizes may alternatively be used. Only high-level details regarding typical DRAM devices are provided herein, and further technical features, functions, and other details may be obtained by consulting a DRAM manufacturer's datasheet. One such datasheet is for the Micron Technology, Inc.'s 8 Gb: ×4, ×8, ×16 DDR SDRAM (Part Nos. MT40A2G4, MT40A1G8, and MT40A512M16), 8gb_ddr4_dram.pdf—Rev. S December 2020 EN (available at https://www.micron.com/-/media/client/global/documents/products/data-sheet/dram/ddr4/8gb_ddr4_sdram.pdf), the entirety of which is incorporated by reference herein.

The DRAM device 208 includes an array 110 of memory cells. It should be understood that in some implementations, the DRAM device 208 can include additional arrays of memory cells. In some implementations, the DRAM device 208 can include multiple banks (and/or bank groups) of memory cells, and each bank can have an array of memory cells. The memory cells in the array 110 can be identified by rows and columns. For example, a particular bank (of which array 110 might be a part) might have 64 arrays of 65,536 rows×128 columns, which can be equivalently represented (logically and functionally) as a single 65,536×128 array of 64-bit words. In the illustration of FIG. 3, each row and column identifies the location of a 64-bit word. Only one column 138 in the array has been expanded to conceptually illustrate storing a word in the array 110, as described below.

As an example, the array 110 of memory cells can include multiple rows 130a-g and columns 132-144. Although seven rows 130a-130g are illustrated, in some implementations, the array 110 of memory cells can include 65,536 rows that are identified by unique row addresses. For example, each row 130a-g can be identified by a sixteen bit (e.g., [15:0]) binary number. In the illustrative example of FIG. 3, the row 130d is identified by a row address 150. For example, the row address 150 can be provided to a row demultiplexer 112, and based on the row address 150, the demultiplexer 112 is configured to select (e.g., activate) the row 130d.

Similarly, although only seven columns 132-144 are illustrated (with column 138 being expanded to illustrate an entire word), in some implementations, the array 110 of memory cells can include 128 columns that are identified by unique column addresses. For example, each column 132-144 can be identified by a seven bit (e.g., [9:3]) binary number. In the example of FIG. 3, the column 138 associated with a first memory cell 146a of memory cells 146 storing particular data content 148 is identified by the seven most significant bits [9:3] of a column address 152. The particular data content 148 is located in the row 130d associated with the row address 150 and the column 138 associated with the column address 152. Again, column 138 is shown expanded to indicate that a word (e.g., a 64-bit word) is stored at each row-column location of the array 110. Individual cell 146a of row 130d and column 138 in array 110 stores a single bit of data in the 64-bit word comprising cells 146. Other cells shown immediately to the right of cell 146a in the memory cells 146 (all in column 138) store other bits in the word, so that the entire word (particular data content 148) is stored at a location represented by row 130d and column 138.

The memory cells depicted in the array 110 each store a bit, such as a binary value (e.g., a logical "1" value or a logical "0" value). The group of memory cells 146, starting with the first memory cell 146a in the array 110 and continuing with other memory cells at the same row/column location, stores particular data content 148 indicated by a series of logical "1" values and "logical "0" values. In the illustrative example, the particular data content 148 corresponds to one 64-bit word. However, it should be understood that in other implementations, the particular data content 148 can be any appropriate length. The first bit of the particular data content 148 is located at a first memory cell 146a. The first memory cell 146a is located in the row 130d and the column 138. Thus, an address of the location of the first memory cell 146a can include the row address 150 and the column address 152. The particular data content 148 is located in the memory cells 146, which corresponds to sixty-four sequential memory cells in the row 130d, starting with the first memory cell 146a in the array and including memory cells in the same row 130d and column 138. For ease of illustration, other memory cells in the array 110 are shown to store a logical "x" value (e.g., a "don't care" value).

Referring back to FIG. 2C, the DRAM controller 206 is configured to issue the ACTIVATE command 228 to the DRAM device 208. The ACTIVATE command 228 has the row address 150 of the row 130d in the array 110 of memory cells. As shown in FIG. 2C, the present example depicts Initiator B issuing the READ-THEN-CLEAR memory command 290. The translator 299 is configured to translate the memory address in the READ-THEN-CLEAR memory command 290 into multiple DRAM address parts, including the row address 150. In response to a determination that the row 130d associated with the row address 150 is not selected, the DRAM controller 206 issues the ACTIVATE command 228 to the DRAM device 208 so that the DRAM device 208 selects the row 130d. Thus, in scenarios where the row 130d is already selected, the DRAM controller 206 can bypass issuance of the ACTIVATE command 228. To issue the ACTIVATE command 228, the DRAM controller 206 can queue the ACTIVATE command 228 into the ADDR+CMD FIFO buffer 214 of the DRAM controller 206, as shown in FIG. 2C. As noted above, the queued ACTIVATE command 228 has the row address 150 of the row 130d. The ACTIVATE command 228 is provided to the DRAM device 208.

The DRAM device 208 is configured to receive the ACTIVATE command 228 from the DRAM controller 206. Referring to FIG. 3, in response to receiving the ACTIVATE command 228, the DRAM device 208 is configured to select the row 130d. For example, the row address 150 is provided to the demultiplexer 112, and the demultiplexer 112 selects the row 130d based on the row address 150. Selection of the row 130d causes the data content in the row 130d to be latched into row buffer 114. For example, if the selected row 130d contains 128 words, with each word consisting of 64 bits, then 8,192 bits are latched into the row buffer 114. As illustrated in FIG. 3, the particular data content 148 is included in the data content in the row 130d; therefore, the particular data content 148 is part of the data content latched into the row buffer 114. Referring back to FIG. 2C, the DRAM controller 206 is configured to issue the single READ-THEN-CLEAR command 230 to the DRAM device 208. The single READ-THEN-CLEAR command 230 has the column address 152 of the column 138 in the array 110 of memory cells in the DRAM device 208. For example, the translator 299 is configured to translate the memory address in the READ-THEN-CLEAR memory command 290 into multiple DRAM address parts, including the column address 152. Based on the translation, the DRAM controller 206 inserts the column address 152 in the single READ-THEN-CLEAR command 230. To issue the single READ-THEN-CLEAR command 230, the DRAM controller 206 can queue the single READ-THEN-CLEAR command 230 into the ADDR+CMD FIFO buffer 214 of the DRAM controller 206, as shown in FIG. 2C. The single READ-THEN-CLEAR command 230 is provided to the DRAM device 208.

The DRAM device 208 is configured to receive the single READ-THEN-CLEAR command 230 from the DRAM controller 206. Referring to FIG. 3, in response to receiving the single READ-THEN-CLEAR command 230, the DRAM device 208 is configured to read the particular data content 148 from a location in the row buffer 114 identified by the column address 152. For example, the DRAM device 208 selects the particular data content 148 from the location in the row buffer 114 based on most significant bits of the column address 152. To illustrate, seven bits (e.g., the most significant bits [9:3]) of the column address 152 are provided to column decoder 116. The column decoder 116 can use the most significant bits of the column address 152 to identify the location in the row buffer 114 that contains the particular data content 148, which originated from memory cells 146.

Reading the particular data content 148 also includes the column decoder 116 providing the particular data content 148 to input-output buffer 118 after the particular data content 148 is selected by the column decoder 116 from the row buffer 114. The input-output buffer 118 then contains the bits making up the word of the particular data content 148.

After the particular data content 148 is in the input-output buffer 118, the particular data content 148 is output, via data interface 122 (e.g., a bus to one or more input-output pins on the DRAM device 208), to complete the read operation. In order to provide that word as output back to the initiator (e.g., Initiator B 202, shown in FIG. 2C), the DRAM device 208 includes an output multiplexer 120 to provide the output in a burst comprising a series of beats (one for each clock cycle). (The output multiplexer 120 would likely also serve as a demultiplexer for write commands. However, for the READ-THEN-CLEAR command 230 discussed here, only multiplexing is performed, in order to provide the output word to a data bus back to the command initiator.) Output multiplexer 120 selects a subset of the particular data content 148 in input-output buffer 118, and outputs it via the data interface 122 as the first beat of the burst. The least significant bits of the column address select the subset of data output in the first burst. Over successive periods of time, the rest of the contents in the input-output buffer 118 is output. As an example, in FIG. 3, bits [2:0] from the column address 152 are provided to the output multiplexer 120. In this example, if the input-output buffer 118 contains 64 bits (i.e., one word), then for an 8:1 output multiplexer 120, this allows the full contents of the input-output buffer 118 to be output in an 8-beat burst, with each beat containing 8 bits.

The length of a burst depends on the ratio of the size of the input-output buffer 118 to the width of the data interface 122. For the present example, the size of the input-output buffer is 64 bits, so if the data interface 122 (the DRAM data bus) is 8 bits, then the burst is 8 beats. Thus, reading the particular data content 148 would span a duration of eight clock cycles. If, instead, the width of the data interface is 4 bits, then the burst length would be 16 beats, and reading the particular data content 148 (e.g., the 64-bit word) would span a duration of sixteen clock cycles.

As set forth above, data read during a READ-THEN-CLEAR would go back to the one or more of the initiators shown in FIG. 2A. An initiator issues a READ-THEN-CLEAR memory command to the DRAM controller, and the DRAM controller returns read data back to the initiator.

In response to receiving the single READ-THEN-CLEAR command 230 and after the read operation is complete, the DRAM device 208 clears the particular data content 148. Clearing the particular data content 148 includes clearing the particular data content 148 from the location in the row buffer 114 identified by the most significant bits of column address 152, which are shown in FIG. 3 as provided to the row buffer 114. Clearing the particular data content 148 includes replacing the particular data content 148 with zero ("0") data values. Because the row 130d is latched to the row buffer 114, the particular data content 148 is accordingly cleared from the array 110 of memory cells (e.g., cleared from the row 130d) in response to clearing the particular data content 148 from the location in the row buffer 114.

As with a READ command, after issuing a READ-THEN-CLEAR command, the DRAM controller 206 can issue the PRECHARGE command 232 to the DRAM device 208. To issue the PRECHARGE command 232, the DRAM controller 206 can queue the PRECHARGE command 232 into the ADDR+CMD FIFO buffer 214 of the DRAM controller 206, as shown in FIG. 2C. The PRECHARGE command 232 is provided to the DRAM device 208.

The DRAM device 208 is configured to receive the PRECHARGE command 232 from the DRAM controller 206 after clearing the particular data content 148. Referring to FIG. 3, in response to receiving the PRECHARGE command 232, the DRAM device 208 is configured to deselect the row 130d associated with the row address 150. For example, the DRAM device 208 deselects the row 130d and charges each row 130 in the array 110 so another row 130 of memory cells can be sensed.

Using the single READ-THEN-CLEAR command 230 provides a number of improvements. One improvement is that the number of issued DRAM commands can be reduced. For instance, the steps of reading data from the memory cells 146 and writing zeros to those memory cells 146 can be carried out by issuing the singular READ-THEN-CLEAR command 230, instead of issuing two separate series of commands, namely a series of READ commands and a series of WRITE commands. Another improvement is that the quantity of write data that is issued during printing can be reduced. For instance, when clearing memory cells 146, a conventional WRITE command usually includes write data that specifies writing zeros into the DRAM cells. However, according to the techniques described above, the DRAM device 208 itself can be designed to automatically infer writing zeros into the memory cells 146 in response to issuance of the single READ-THEN-CLEAR command 230.

The READ-THEN-CLEAR command 230 described herein is a new DRAM command to be utilized directly with a DRAM device. A DRAM device typically receives commands (e.g., ACTIVATE, READ, WRITE, and/or PRECHARGE commands) and accompanying addresses as encoded bit patterns on the pins of the DRAM device. For example, an ACTIVATE command might include asserting a logical "1" on an "ACT" pin, with a row address provided at one or more other pins of the DRAM device. READ and WRITE commands might include asserting a logical "1" on a column strobe pin and either a logical "1" or "0" on a write-enable pin, along with a column address at a plurality of other pins of the DRAM device. The READ-THEN-CLEAR command 230 described herein could, for example, be encoded similarly to a READ command, but with one additional (normally unused/ignored) pin used (e.g., by asserting a logical "1" or "0") to indicate that the READ-THEN-CLEAR command 230 has been provided, rather than a simple READ command. Other encodings could alternatively be used. Higher-level components, such as the DRAM controller 206, memory network 204, and initiators 202 would also preferably support a READ-THEN-CLEAR command (e.g., the READ-THEN-CLEAR commend 290).

Figure 4:
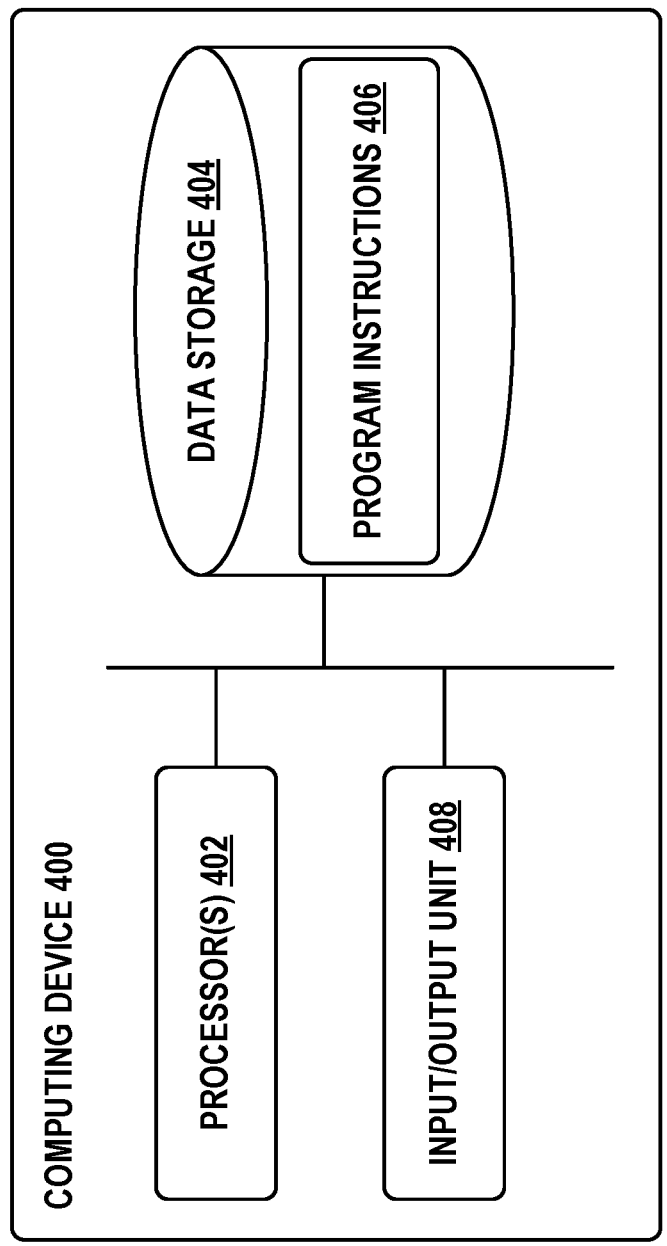
FIG. 4 is a simplified block diagram of a computing device, according to an example embodiment.

FIG. 4 illustrates a simplified block diagram of a computing device 400, which can be configured to carry out one or more methods, processes, or functions disclosed in this specification and/or the accompanying drawings. Any of the components described above, such as the initiators 202, the memory network 204, and/or the DRAM controller 206, can be implemented as, or can be integrated within, the computing device 400 and/or by using equivalent logic circuitry or components. Generally, the manner in which the computing device 400 is implemented can vary, depending upon the particular application.

The computing device 400 can include one or more processors 402, data storage 404, program instructions 406, and an input-output unit 408, all of which can be coupled by a system bus or a similar mechanism. The one or more processors 402 can include one or more central processing units (CPUs), such as one or more general purpose processors and/or one or more dedicated processors (e.g., application specific integrated circuits (ASICs) or digital signal processors (DSPs), etc.). The one or more processors 402 can be configured to execute computer-readable program instructions 406 that are stored in the data storage 404 and are executable to provide at least part of the functionality described herein.

The data storage 404 can include or take the form of one or more non-transitory, computer-readable storage media that can be read or accessed by at least one of the one or more processors 402. The non-transitory, computer-readable storage media can include volatile and/or non-volatile storage components, such as optical, magnetic, organic, or other memory or disc storage, which can be integrated in whole or in part with at least one of the one or more processors 402. In some embodiments, the data storage 404 can be implemented using a single physical device (e.g., one optical, magnetic, organic, or other memory or disc storage unit), while in other embodiments, the data storage 404 can be implemented using two or more physical devices.

The input-output unit 408 can include network input-output devices. Network input-output devices can include wired network receivers and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network, and/or wireless network receivers and/or transceivers, such as a Bluetooth transceiver, a Zigbee transceiver, a Wi-Fi transceiver, a WiMAX transceiver, a wireless wide-area network (WWAN) transceiver and/or other similar types of wireless transceivers configurable to communicate via a wireless network.

The input-output unit 408 can additionally or alternatively include user input-output devices and/or other types of input-output devices. For example, the input-output unit 308 can include a touch screen, a keyboard, a keypad, a computer mouse, liquid crystal displays (LCD), light emitting diodes (LEDs), displays using digital light processing (DLP) technology, cathode ray tubes (CRT), light bulbs, and/or other similar devices.

Figure 5:
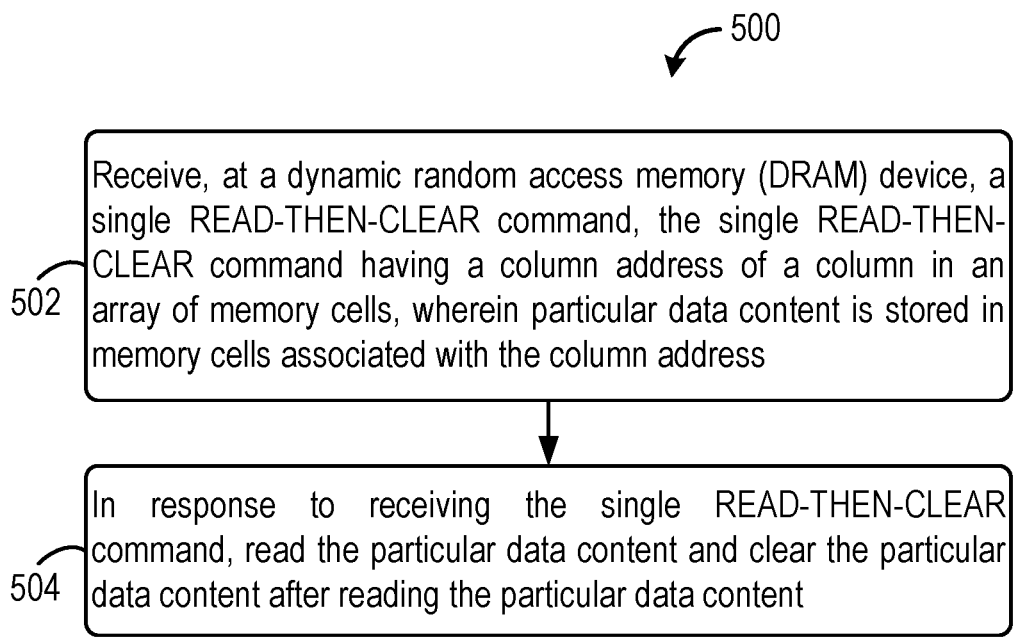
FIG. 5 is a flowchart of a method, according to an example embodiment.

FIG. 5 depicts a flowchart of an example method 500 that can be carried out in connection with one or more of the printing systems described herein. The example method 500 can include one or more operations, functions, or actions, as depicted by one or more of blocks 502, 504, and/or 506, each of which can be carried out by the printing system 200 described by way of FIGS. 2A-C; however, other configurations could be used as well.

Furthermore, those skilled in the art will understand that the flowchart described herein illustrates functionality and operation of certain implementations of example embodiments. In this regard, each block of the flowchart can represent a module or a portion of program code, which includes one or more instructions executable by a processor for implementing, managing, or driving specific logical functions or steps in the method 500. The program code can be stored on any type of computer readable medium, for example, such as a storage device including a disk or hard drive. In addition, each block can represent circuitry that is wired to perform the specific logical functions in the method 500. Alternative implementations are included within the scope of the example embodiments of the present application in which functions can be executed out of order from that shown or discussed, including substantially concurrent order, depending on the functionality involved, as would be understood by those reasonably skilled in the art.

Referring to FIG. 5, the method 500 includes receiving, at a DRAM device, a single READ-THEN-CLEAR command, at 502. The single READ-THEN-CLEAR command has a column address of a column in an array of memory cells, and particular data content is stored in memory cells associated with the column address. For example, referring to FIG. 2C, the DRAM device 208 receives the single READ-THEN-CLEAR command 230 from the DRAM controller 206. The single READ-THEN-CLEAR command 230 has the column address 152 of the column 138 in the array 110 of memory cells.

The method 500 also includes, in response to receiving the READ-THEN-CLEAR command, reading the particular data content and clearing the particular data content after reading the particular data content, at 504. For example, referring to FIG. 3, the DRAM device 208 reads the particular data content 148 and clears the particular data content 148, as described above, in response to receiving the READ-THEN-CLEAR command 230.

According to one implementation of the method 500, reading the particular data content includes reading the particular data content from a location in a row buffer identified by the column address. For example, referring to FIG. 3, the DRAM device 208 reads the particular data content 148 from the location in the row buffer 114 identified by the column address 152. According to one implementation of the method 500, reading the particular data content 148 from the location in the row buffer 114 includes (i) selecting the particular data content 148 from the location in the row buffer 114 based on one or more most significant bits (e.g., bits [9:3]) associated with the column address 152, (ii) providing the particular data content 148 to the input-output buffer 118 after particular data content 148 is selected, and (iii) outputting the particular data content 148.

According to one implementation of the method 500, clearing the particular data content 148 includes clearing the particular data content from a location in a row buffer identified by the column address. For example, referring to FIG. 3, the DRAM device 208 clears the particular data content 148 from the location in the row buffer 114 identified by the column address 152. The particular data content 148 is accordingly cleared from the array 110 of memory cells in response to clearing the particular data content 148 from the location in the row buffer 114.

According to one implementation, the method 500 includes, prior to receiving the single READ-THEN-CLEAR command, receiving an ACTIVATE command that has a row address of a row in the array of memory cells. For example, referring to FIG. 2C, the DRAM device 208 receives the ACTIVATE command 228 from the DRAM controller 206. The method 500 can also include selecting the row in response to receiving the ACTIVATE command. For example, referring to FIG. 2C, the DRAM device 208 selects the row 130d in response to receiving the ACTIVATE command 228. Selection of the row 130d causes data content in the row 130d to be latched into the row buffer 114. The particular data content 148 is included in the data content in the row 130d.

According to one implementation, the method 500 includes receiving a PRECHARGE command after clearing the particular data content. For example, referring to FIG. 2C, the DRAM device 208 receives the PRECHARGE command 232 from the DRAM controller 206. The method 500 can also include deselecting a row associated with a row address in response to receiving the PRECHARGE command. For example, referring to FIG. 3, the DRAM device 208 deselects the row 130d in response to receiving the PRECHARGE command 232.

The method 500 enables a reduction in the number of issued DRAM commands. For instance, the steps of reading data from the memory cells 146 and writing zeros to those memory cells 146 can be carried out by issuing the singular READ-THEN-CLEAR command 230, instead of issuing two separate series of commands, namely a series of READ commands and a series of WRITE commands. Another improvement is that the quantity of write data that is issued during printing can be reduced. For instance, when clearing memory cells 146, a conventional WRITE command usually includes write data that specifies writing zeros into the DRAM cells. However, according to the method 500, the DRAM controller 206 can be designed to automatically infer writing zeros into the memory cells 146 in response to issuance of the single READ-THEN-CLEAR command 230.

III. CONCLUSION

The particular arrangements shown in the Figures should not be viewed as limiting. It should be understood that other embodiments can include more or less of each element shown in a given Figure. Further, some of the illustrated elements can be combined or omitted. Yet further, example embodiments can include elements that are not illustrated in the Figures.

Additionally, while various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

What is claimed is:

1. A method comprising:
receiving, at a dynamic random access memory (DRAM) controller, a single READ-THEN-CLEAR memory command to effect both a read operation and a clear operation via the single READ-THEN-CLEAR memory command, wherein the single READ-THEN-CLEAR memory command is in a memory domain that differs from a DRAM device domain, and wherein the single READ-THEN-CLEAR memory command includes (a) a READ-THEN-CLEAR type of memory operation and (b) a memory address at which to perform the READ-THEN-CLEAR type of memory operation;
translating, at the DRAM controller, the single READ-THEN-CLEAR memory command in the memory domain into a single READ-THEN-CLEAR DRAM command in the DRAM device domain, wherein the translating includes translating the memory address into multiple address parts for addressing an array of memory cells in a DRAM device, the multiple address parts including a column address of a column in the array of memory cells in the DRAM device, wherein the translating further includes inserting the column address into the single READ-THEN-CLEAR DRAM command in the DRAM device domain, and wherein particular data content is stored in memory cells associated with the column address;

queuing, at the DRAM controller, the single READ-THEN-CLEAR DRAM command into a buffer in the DRAM controller;
issuing, by the DRAM controller to the DRAM device, the single READ-THEN-CLEAR DRAM command as an encoded bit pattern specific to the single READ-THEN-CLEAR DRAM command, wherein the encoded bit pattern differs from respective encoded bit patterns for a READ DRAM command and a WRITE DRAM command;
receiving, at the DRAM device, the single READ-THEN-CLEAR DRAM command via the encoded bit pattern specific to the single READ-THEN-CLEAR DRAM command; and
in response only to receiving the single READ-THEN-CLEAR DRAM command and without requiring any additional command besides the single READ-THEN-CLEAR DRAM command, the DRAM device:
reading the particular data content; and
clearing the particular data content after reading the particular data content, wherein the clearing comprises the DRAM device replacing, no earlier than when the particular data content is latched into an input-output buffer, the particular data content from a location in a row buffer identified by the column address by setting the memory cells associated with the column address to zero.

2. The method of claim 1, further comprising, prior to receiving the single READ-THEN-CLEAR DRAM command:
receiving an ACTIVATE DRAM command that has a row address of a row in the array of memory cells, wherein the row address is one of the multiple address parts for addressing the array of memory cells in the DRAM device, as translated by the DRAM controller from the memory address; and
selecting the row in response to receiving the ACTIVATE DRAM command, wherein selection of the row causes data content in the row to be latched into a row buffer, and wherein the particular data content is included in the data content in the row.

3. The method of claim 1, wherein reading the particular data content comprises reading the particular data content from a location in a row buffer identified by the column address.

4. The method of claim 3, wherein reading the particular data content from the location in the row buffer comprises:
selecting the particular data content from the location in the row buffer based on one or more most significant bits associated with the column address;
providing the particular data content to an input-output buffer after the particular data content is selected; and
outputting the particular data content.

5. The method of claim 1, further comprising:
receiving a PRECHARGE DRAM command after clearing the particular data content; and
deselecting a row associated with a row address in response to receiving the PRECHARGE DRAM command.

6. The method of claim 1, wherein the DRAM device is included in a printing system.

7. The method of claim 1, wherein the particular data content includes image data.

8. A printing system comprising:
an initiator configured to generate a single READ-THEN-CLEAR memory command to effect both a read operation and a clear operation via the single READ-THEN- CLEAR memory command, wherein the initiator is one of a plurality of initiators, wherein the single READ-THEN-CLEAR memory command is in a memory domain that differs from a DRAM device domain, and wherein the single READ-THEN-CLEAR memory command includes (a) a READ-THEN-CLEAR type of memory operation and (b) a memory address at which to perform the READ-THEN-CLEAR type of memory operation;

a memory network configured to:
  receive the single READ-THEN-CLEAR memory command from the initiator;
  arbitrate and multiplex the single READ-THEN-CLEAR memory command received from the initiator from among a plurality of memory commands received from the plurality of initiators;
  provide the single READ-THEN-CLEAR memory command to a dynamic random access memory (DRAM) controller;

the DRAM controller configured to:
  translate the single READ-THEN-CLEAR memory command in the memory domain to a single READ-THEN-CLEAR DRAM command in the DRAM device domain, wherein the translating includes translating the memory address into multiple address parts for addressing an array of memory cells in a DRAM device, the multiple address parts including a column address of a column in the array of memory cells in the DRAM device, wherein the translating further includes inserting the column address into the single READ-THEN-CLEAR DRAM command in the DRAM device domain, wherein particular data content is stored in memory cells associated with the column address;
  queue the single READ-THEN-CLEAR DRAM command into a buffer in the DRAM controller; and
  provide the single READ-THEN-CLEAR DRAM command to the DRAM device as an encoded bit pattern specific to the single READ-THEN-CLEAR DRAM command, wherein the encoded bit pattern differs from respective encoded bit patterns for a READ DRAM command and a WRITE DRAM command; and the DRAM device configured to:
  receive the encoded bit pattern specific to the single READ-THEN-CLEAR DRAM command to receive the single READ-THEN-CLEAR DRAM command; and
  in response only to receiving the single READ-THEN-CLEAR DRAM command and without requiring any additional command besides the single READ-THEN-CLEAR command:
    read the particular data content; and
    clear the particular data content after reading the particular data content by replacing, no earlier than when the particular data content is latched into an input-output buffer, the particular data content from a location in a row buffer identified by the column address by setting the memory cells associated with the column address to zero.

9. The printing system of claim 8, wherein the DRAM controller is further configured to provide an ACTIVATE DRAM command to the DRAM device prior to providing the single READ-THEN-CLEAR DRAM command to the DRAM device, wherein the ACTIVATE DRAM command has a row address of a row in the array of memory cells, wherein the row address is one of the multiple address parts for addressing an array of memory cells in a DRAM device, as translated by the DRAM controller from the memory address, and wherein the DRAM device is further configured to:
  receive the ACTIVATE DRAM command; and
  select the row in response to receiving the ACTIVATE DRAM command, wherein selection of the row causes data content in the row to be latched into a row buffer, and wherein the particular data content is included in the data content in the row.

10. The printing system of claim 8, wherein reading the particular data content comprises reading the particular data content from a location in a row buffer identified by the column address.

11. The printing system of claim 10, wherein, to read the particular data content from the location in the row buffer, the DRAM device is configured to:
  select the particular data content from the location in the row buffer based on one or more most significant bits associated with the column address; and
  provide the particular data content to an input-output buffer after the particular data content is selected.

12. The printing system of claim 8, wherein the DRAM controller is further configured to provide a PRECHARGE DRAM command to the DRAM device, wherein the PRECHARGE DRAM command has a row address of a row in the array of memory cells, and wherein the DRAM device is further configured to:
  receive the PRECHARGE DRAM command after clearing the particular data content; and
  deselect the row in response to receiving the PRECHARGE DRAM command.

13. A dynamic random access memory (DRAM) controller configured to:
  receive a single READ-THEN-CLEAR memory command to effect both a read operation and a clear operation via the single READ-THEN-CLEAR memory command, wherein the single READ-THEN-CLEAR memory command is in a memory domain that differs from a DRAM device domain, and wherein the single READ-THEN-CLEAR memory command includes (a) a READ-THEN-CLEAR type of memory operation and (b) a memory address at which to perform the READ-THEN-CLEAR type of memory operation;
  translate the single READ-THEN-CLEAR memory command in the memory domain into a single READ-THEN-CLEAR DRAM command in the DRAM device domain, wherein the translating includes translating the memory address into multiple address parts for addressing an array of memory cells in a DRAM device, the multiple address parts including a column address of a column in the array of memory cells in the DRAM device, wherein the translating further includes inserting the column address into the single READ-THEN-CLEAR DRAM command in the DRAM device domain, wherein particular data content is stored in memory cells associated with the column address;
  queue the single READ-THEN-CLEAR DRAM command into a buffer in the DRAM controller; and
  issue, to the DRAM device, the single READ-THEN-CLEAR DRAM command as an encoded bit pattern specific to the single READ-THEN-CLEAR DRAM command, wherein the encoded bit pattern differs from respective encoded bit patterns for a READ DRAM command and a WRITE DRAM command, and wherein, in response only to receiving the single READ-THEN-CLEAR DRAM command and without requiring any additional command besides the single READ-THEN-CLEAR DRAM command, the DRAM device:

reads the particular data content; and clears the particular data content after reading the particular data content by replacing, no earlier than when the particular data content is latched into an input-output buffer, the particular data content from a location in a row buffer identified by the column address by setting the memory cells associated with the column address to zero.

14. The DRAM controller of claim 13, wherein the DRAM device and the DRAM controller are included in a printing system.

15. The DRAM controller of claim 13, further configured to issue an ACTIVATE DRAM command to the DRAM device prior to issuing the single READ-THEN-CLEAR DRAM command to the DRAM device, wherein the ACTIVATE DRAM command has a row address of a row in the array of memory cells, and wherein the row address is one of the multiple address parts for addressing the array of memory cells in the DRAM device, as translated by the DRAM controller from the memory address.

* * * * *